United States Patent
Kimura et al.

(10) Patent No.: US 12,298,343 B2
(45) Date of Patent: May 13, 2025

(54) METHOD OF IDENTIFYING VULNERABLE REGIONS IN AN INTEGRATED CIRCUIT

(71) Applicant: Battelle Memorial Institute, Columbus, OH (US)

(72) Inventors: Adam Gakuto Kimura, Lewis Center, OH (US); Jeremy Bellay, Columbus, OH (US); Thomas Kent, Columbus, OH (US)

(73) Assignee: Battelle Memorial Institute, Columbus, OH (US)

( * ) Notice: Subject to any disclaimer, the term of this patent is extended or adjusted under 35 U.S.C. 154(b) by 234 days.

(21) Appl. No.: 17/907,688

(22) PCT Filed: Mar. 23, 2021

(86) PCT No.: PCT/US2021/023630
§ 371 (c)(1),
(2) Date: Sep. 29, 2022

(87) PCT Pub. No.: WO2021/202163
PCT Pub. Date: Oct. 7, 2021

(65) Prior Publication Data
US 2023/0138247 A1 May 4, 2023

Related U.S. Application Data

(60) Provisional application No. 63/002,848, filed on Mar. 31, 2020.

(51) Int. Cl.
*G01R 31/28* (2006.01)
*G06N 3/0455* (2023.01)

(52) U.S. Cl.
CPC ....... *G01R 31/2898* (2013.01); *G06N 3/0455* (2023.01)

(58) Field of Classification Search
CPC ..................................................... G01R 31/00
See application file for complete search history.

(56) References Cited

U.S. PATENT DOCUMENTS

| | | | |
|---|---|---|---|
| 2011/0313691 A1* | 12/2011 | Dobson | G01R 31/00 702/58 |
| 2017/0345140 A1 | 11/2017 | Zhang et al. | |
| 2019/0372751 A1* | 12/2019 | Yanamadala | H04L 9/004 |
| 2019/0385695 A1* | 12/2019 | Jeong | G11C 29/56 |
| 2020/0090049 A1 | 3/2020 | Aliper et al. | |

OTHER PUBLICATIONS

International Search Report and Written Opinion of International Application No. PCT/US2021/023630, Mail Date Jun. 7, 2021, Completion Date May 13, 2021, 8 pages.

* cited by examiner

*Primary Examiner* — Tung X Nguyen
(74) *Attorney, Agent, or Firm* — Grossman, Tucker, Perreault & PFleger, PLLC; Donald G. Weiss (57) ABSTRACT

A method of designing a robust integrated circuit that is not vulnerable to optical fault injection comprises training a variational autoencoder to identify regions in a target integrated circuit that are vulnerable to optical fault injection and altering the design of the target integrated circuit by altering the design of the vulnerable regions so that the target integrated circuit is no longer vulnerable to optical fault injection, thereby forming the robust integrated circuit.

19 Claims, 7 Drawing Sheets

METHOD OF IDENTIFYING VULNERABLE REGIONS IN AN INTEGRATED CIRCUIT

TECHNICAL FIELD

The present invention relates to identifying locations in integrated circuits which are vulnerable to optical fault injection based on correlation to known vulnerable locations in known integrated circuits.

BACKGROUND

Often electronic semiconductor devices that include microcontrollers with an associated memory are used to store sensitive information that needs to be protected from disclosure. Such information could be software-based security keys, firmware, program data or other valuable information that an owner of the key or software does not want disclosed. These microcontrollers hold the valuable data. There are inherent vulnerabilities in the microcontroller that adversaries can attack. Security features are built into the devices such as fuses, locking bits, etc. to try and make it more difficult for an adversary to do things such as read out memory which contains sensitive programming data of the microcontroller. There are vulnerabilities in the hardware that can allow one to attack them with semi-invasive means to bypass the security features of the microcontroller. This invention allows one to determine the locations of these vulnerabilities so that one can implement design mitigations to harden it to known attacks. The sensitive information can be of many types, such as, financial information, programs, firmware, social security numbers or encryption algorithm keys. Toward that end, manufacturers have designed security features within microcontrollers that protect it from someone accessing the sensitive information. For example, the microcontroller can have internal programming that will lock the microcontroller to prevent access to its memory. Normally, one would need to enter a password that is verified by the microcontroller before access to the memory is allowed. Once the memory is locked, an unauthorized user is not able to read out the memory through conventional means.

As the electronic semiconductor devices are designed to be faster and include a higher density of circuitry while also having reduced power consumption, these semiconductor devices have become vulnerable. For example, some devices are susceptible to what is known as an optical fault injection attack. Generally, fault injection attacks involve causing a transient fault in an electronic device by actively manipulating the microcontroller when it is turned on. More specifically, an optical fault injection is an attack using optical radiation, such as intense white light or a laser beam, to induce a fault within the microcontroller, which can then be exploited. Typically, the electronic device is initially prepared by removing an epoxy layer to access a die (i.e., the package of semiconducting material with the integrated circuit) within the semiconductor device, and then light is focused on the exposed die. A laser is particularly effective, since it can be focused on a specific region of the microcontroller such as a central processing unit, memory decoders, security feature logic or cryptographic components. An induced fault on the security lock feature could cause a state transition, thus bypassing the security measure design and making the microcontroller vulnerable to entire memory dumps.

Since manufacturers of electronic devices know about optical fault injection techniques, several countermeasures have been developed. Hardware barriers, such as metal shields, have been placed on the electronic devices to stop access to the sensitive portions of the electronic device. Sensors and software-based countermeasures have also been employed to detect anomalies caused by injection techniques. Some of the methods for countering optical attacks can be found in U.S. Pat. No. 9,559,066, incorporated herein by reference. Additional information on optical fault attacks can be found in the following references: 1) Schmidt, J-M., et al., "Optical and EM Fault-Attacks on CRT-based RSA: Concrete Results." *Austrochip* 2007, 15*th Austrian Workshop on Microelectronics,* 11 Oct. 2007, *Graz, Austria, Proceedings*. pp. 61-67. Verlag der Technischen Universitat Graz. (2007); 2) Woudenberg, J. G., et al., "Practical Optical Fault Injection on Secure Microcontrollers." 2011 *Workshop on Fault Diagnosis and Tolerance in Cryptography*. pp. 91-99. (2011); and 3) Schmidt, J-M., et al., "Optical Fault Attacks on AES: A Threat in Violet." 6*th Workshop on Fault Diagnosis and Tolerance in Cryptography—FDTC,* IEEE-CS Press., pp. 13-22. (2009), all of which are incorporated herein by reference. One of the problems with developing countermeasures is that manufacturers do not necessarily know which areas of their integrated circuits are vulnerable to attack. The techniques used when designing new integrated circuits focus on the logic performed by the circuit, not the physics involved with building the circuit or the physical characteristics of the design that might be vulnerable to an optical fault injection attack. While some vulnerable locations have been made public, other locations must be discovered, which is a difficult and time-consuming process. Therefore, there exists a need in the art for a method for determining vulnerable locations in an integrated circuit in an electronic device that scales without requiring high computational overhead. If the vulnerabilities could be discovered and known prior to fabrication, countermeasures could be better applied and designed into the integrated circuit to further harden it from exploitation or attacks.

SUMMARY

In general, the inventors have recognized that there is a strong correlation between a local structural architecture around a region that is vulnerable to an optical fault injection attack in an integrated circuit and the region's function as a circuit. Therefore, a method is presented that, based on a known region that is vulnerable, can predict if an unknown region is vulnerable based on a correlation of the structure of the known region to the structure of the unknown region. The method allows for redesigning of new integrated circuits to avoid the potentially vulnerable regions.

More specifically, a microchip with an integrated circuit that has known vulnerable regions that are vulnerable to optical fault injection is employed to train a model within a neural network. First, the microchip with known vulnerable regions is delayered, and an image of the region is produced. Data representing the local known vulnerable region is collected including the structural layout of the metal, polysilicon and oxides making up the local region. Each of the vulnerable regions is represented in multiple layers of the image. Portions of the image that correspond to vulnerable regions are then processed to train the neural network to identify vulnerable locations. The neural net can be any type of neural network, including a convolutional neural network and/or a variational autoencoder, that is able to predict the new locations of new vulnerabilities in a new unverified design. Preferably, a variational autoencoder is employed. A variational autoencoder can be trained to recognize features in images by inputting image data into the variational autoencoder. Once the neural net is trained, a target test chip is processed to find sites that correlate to the known vulnerable locations. This information allows designers to know where vulnerabilities are in the new design as well as what type of vulnerabilities are present, which in turn allows for more securely-designed microchips.

A preferred embodiment of the invention is a method of designing a robust integrated circuit that is not vulnerable to optical fault injection. The method includes obtaining a sample integrated circuit that has a localized region that is known to be vulnerable to optical fault injection techniques. Next, the method includes preparing the sample integrated circuit for imaging, including delayering the sample integrated circuit into layers, polishing the layers and ion etching the layers. Then the sample integrated circuit is imaged. Imaging includes creating an overall layered image of the sample integrated circuit and separating a layered sub image of the localized region from the overall layered image that includes training data about a structural layout of the metal, polysilicon and oxides that make up the localized region. Next the sub image is split into a layered grid and converted into a matrix of training data. A variational autoencoder is then employed to learn, from the training data, a set of latent variables representing a learned model of the localized region. This includes applying convolution filters to the training data, extracting the set of latent variables and deconvoluting the variables. The deconvolution process reconstructs the training data from the latent variables to produce reconstructed data. The reconstructed data is compared to the training data with a loss function that calculates a difference between them. As more training data is provided, the latent variables are adjusted to minimize the loss function and thereby learn features representing a fault region. Preferably, learning data is retrieved from numerous known fault locations to train the variational autoencoder. Once the variational autoencoder has been trained, its latent variables become a learned model of the vulnerable region and are fixed. Target data is then obtained from an image of a test integrated circuit which may have localized regions that are vulnerable to optical fault injection techniques. Prediction of which localized regions in the test integrated circuit are vulnerable to optical fault injection techniques is achieved by applying the learned model to the target data with the variational autoencoder to identify the potential localized regions that may be vulnerable to optical fault injection techniques. Specifically, the latent variables corresponding to a vulnerable location fit within one or more clusters, and, therefore, a probability can be calculated as to whether vulnerabilities exist in certain locations in the target integrated circuit. This information is used to alter a design of the test integrated circuit to adjust the potential localized regions so that the potential localized regions are not vulnerable to an optical fault injection, thereby forming the robust integrated circuit.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings.

DESCRIPTION OF THE PREFERRED EMBODIMENTS

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment can be incorporated into an additional embodiment unless clearly stated to the contrary. While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

As used in this specification and the appended claims, the singular forms "a", "an" and "the" include plural referents unless the content clearly dictates otherwise. As used in this specification and the appended claims, the term "or" is generally employed in its sense including "and/or" unless the content clearly dictates otherwise.

In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

As used throughout, any ranges disclosed herein are used as shorthand for describing each and every value that is within the range. Any value within the range can be selected as the terminus of the range.

Figure 1:
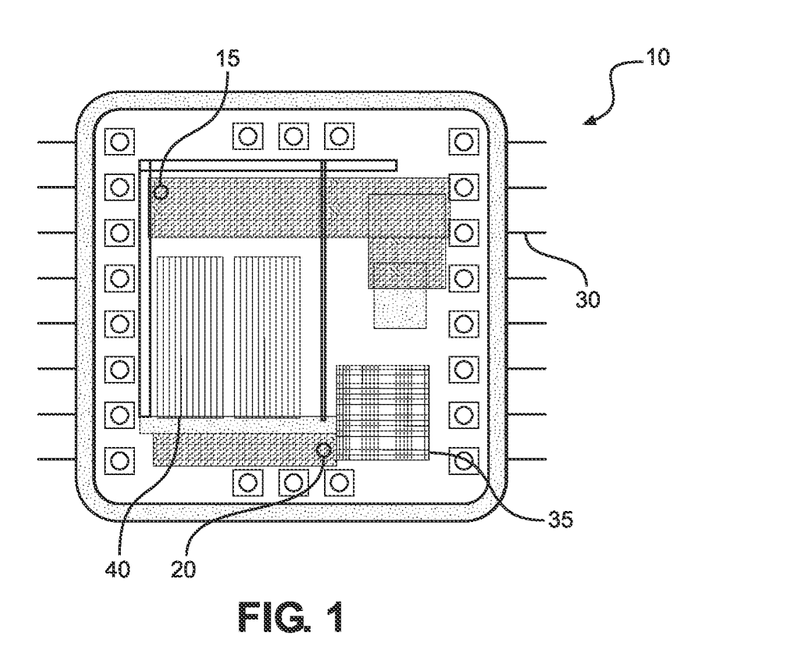
FIG. 1 is a drawing of a top view of an integrated circuit (IC) chip having known locations vulnerable to optical fault injection (OFI).

FIG. 1 shows a sample integrated circuit 10 having regions 15, 20 that are vulnerable to optical fault injection attacks. Integrated circuit 10 can be any type of integrated circuit with known fault regions. Circuit 10 has a sixteen-pin interface 30 for connection to external components. Circuit 10 also includes a central processing unit 35 (e.g., an 8-bit processor) and memory 40 (e.g., 64 bytes of random-access memory). The specific type of integrated circuit is not important. FIG. 1 is simply presented to show that regions 15 and 20 are known. Also, while only one integrated circuit is shown, preferably numerous integrated circuits, all having known vulnerable locations, are to be employed.

Figure 2:
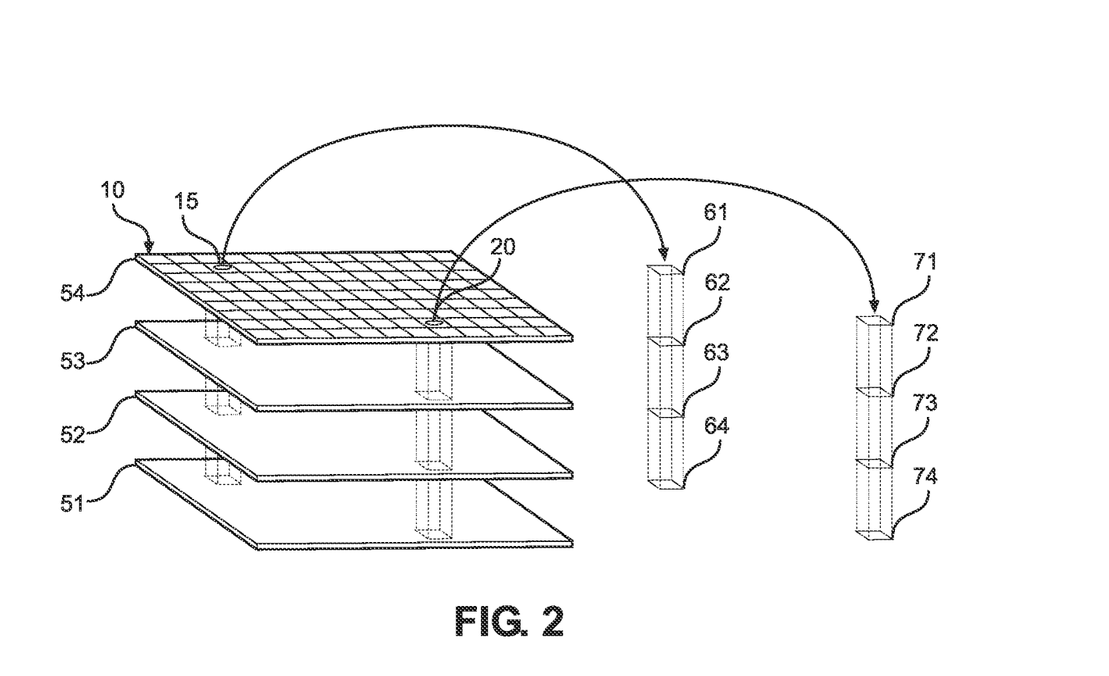
FIG. 2 is an exploded view of an image generated from the IC of FIG. 2.

FIG. 2 shows integrated circuit 10 delayered and imaged into four representative surface layer images 51-54. To form representative surface layer images 51-54, several different samples of circuit 10 are used. The first sample (not shown) is cut along a cross section to reveal various layers present in integrated circuit 10, and, more importantly, the depths of the various layers are determined. The actual "delayering process" involves removing material from circuit 10 until a desired level has been reached to provide an exposed surface layer which is imaged to form image 51. The delayering process is repeated to develop a series of exposed layers which are imaged to form images 52-54. Images 51-54 are then tiled to from a grid of square tiles. The material can be removed by numerous standard techniques such as etching in a plasma etcher, polishing with a diamond grinding wheel, employing reactive ion etching or combinations thereof. More details regarding delayering an integrated circuit can be found in U.S. Pat. No. 7,504,337, incorporated herein by reference. Through delayering and imaging, vulnerable region 15 is represented as data located in four square image tiles 61-64 (one from each of images 51-54), while vulnerable location 20 is represented as data located in another four square image tiles 71-74.

Figure 3A:
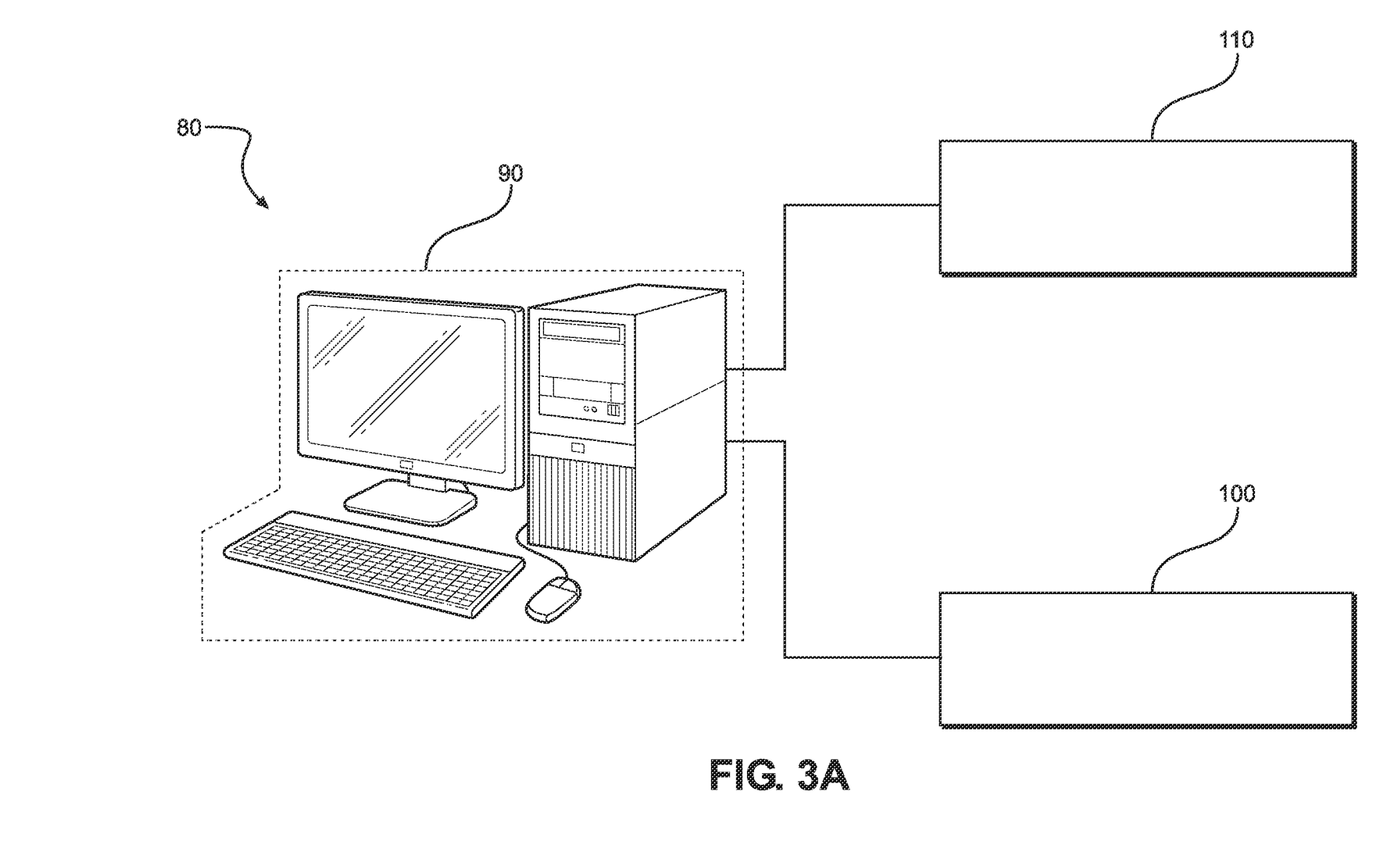
FIG. 3A is a schematic view of a system, including a variational autoencoder, for predicting locations in a newly-designed IC that may be vulnerable to an OFI attack.

FIG. 3A shows a system 80 for predicting vulnerable locations. System 80 includes a computer system 90 connected to a deep neural network model 100, such as a variational autoencoder, and a source of image data 110. Network model 100 can be a variational autoencoder, a recurrent neural network, a long-term short memory, a convolutional neural network, or any other type of deep neural network model.

Figure 3B:
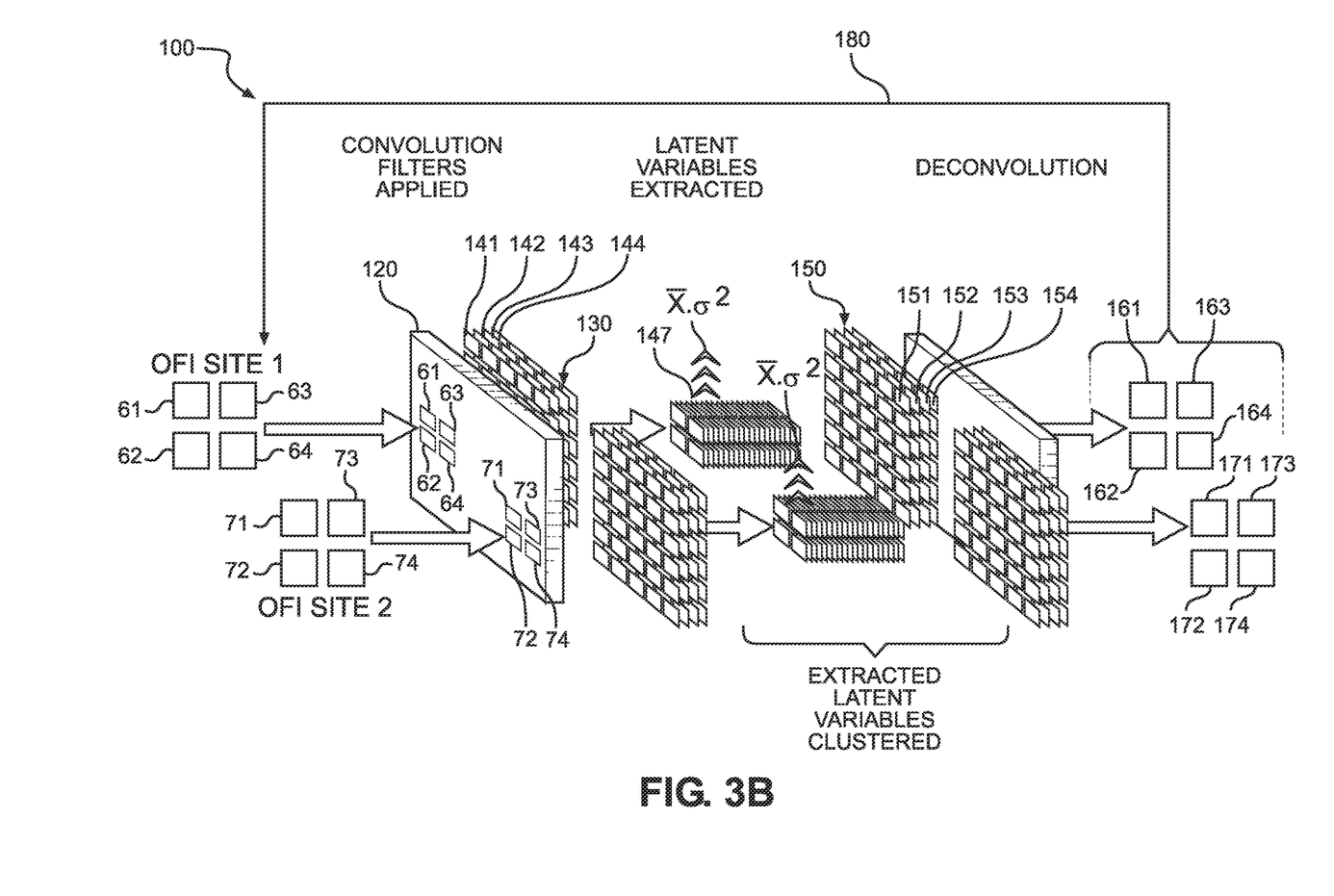
FIG. 3B is a detail dataflow view of the variational autoencoder of FIG. 3A.

Preferably, deep neural network model 100 is a variational autoencoder, as shown in more detail in FIG. 3B. Overall, variational autoencoder 100 includes an input 120, which is configured to receive data such as that found in tiles 61-64 and 71-74. Input 120 feeds into an encoder 130 having four filter layers 141-144. Each of filter layers 141-144 has a plurality of convolutions with increasing numbers of filters in each layer for processing the data from tiles 61-64 and 71-74 into latent variable vectors 147, which are a compressed representation of the input data and have a lower dimensionality when compared to the input data. Preferably, encoder 130 constrains latent variable vectors 147 to follow a unit Gaussian or standard distribution. Latent variables 147 are then extracted. Preferably, latent variable vectors 147 include both a vector representing an average or mean value $\overline{X}$ of the data and another vector representing the standard deviation squared ($\sigma^2$) or variance of the data. These vectors are combined into a sampled vector. Latent variable vectors 147 are also processed by a decoder 150 which includes a plurality of deconvolution layers 151-154 with filters for regenerating the image data found in tiles 61-64 and 71-74 to form regenerated image tiles 161-164 and 171-174. While only four filter layers are shown, a variational autoencoder can include many more layers and thus learn more features of the image data. A loss function is included that compares regenerated image data in tiles 161-164 and 171-174 with the input image data found in tiles 61-64 and 71-74 and alters encoder 130 to 1) generate latent variables 147 that minimize the difference between the regenerated image data and the input image data and 2) separate latent variables with similar features into clusters. Preferably, a Kullback-Leibler divergence is introduced into the loss function. Minimizing the difference and the divergence optimizes the latent variables to closely represent the image data and keep the clusters from separating too far from each other. Variational auto encoders are known in the art, and more details of how variational autoencoders are used to process image data are found in U.S. Patent Application Nos. 2017/0230675 and 2019/0017374, both of which are incorporated herein by reference, and in the following three articles, all of which are incorporated herein by reference: 1) Kingma, D. P., et al. "Auto-Encoding Variational Bayes." *CoRR, abs*/1312.6114 (2013); 2) Doersch, C. "Tutorial on Variational Autoencoders." *CoRR abs*/1606.05908 (2016); and 3) Volpi, S., et al., "Learning in Variational Autoencoders with Kullback-Leibler and Renyi Integral Bounds." *CoRR, abs*/1807.01889 (2018).

Figure 4A:
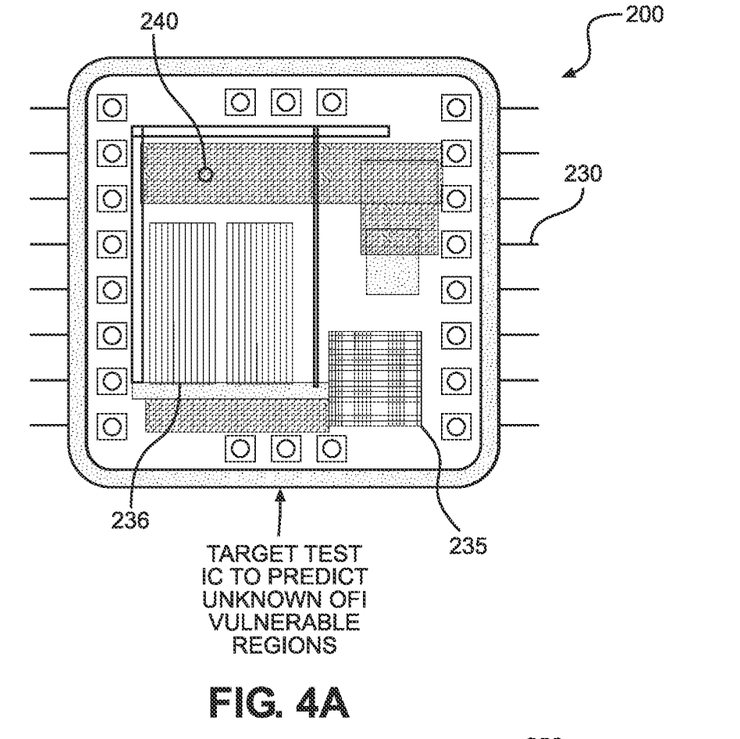
FIG. 4A is a schematic top view of the newly-designed IC containing OFI vulnerabilities not yet discovered.

FIG. 4A shows a target test integrated circuit 200. Integrated circuit 200 can be any type of integrated circuit with unknown fault regions. Preferably, circuit 200 is under development. Circuit 200 has a sixteen-pin interface 230 for connection to external components, but any number of pins can be present. Circuit 200 also includes a central processing unit 235 (e.g., an 8-bit processor) and memory 236 (e.g., 64 bytes of random-access memory). The specific type of integrated circuit is not important. FIG. 4A is simply presented to show that locations of fault regions are unknown. Also, while only one integrated circuit is shown, several samples of the one circuit are processed, delayered and imaged to produce test image data in a manner similar to how integrated circuit 10 is processed.

Figure 4B:
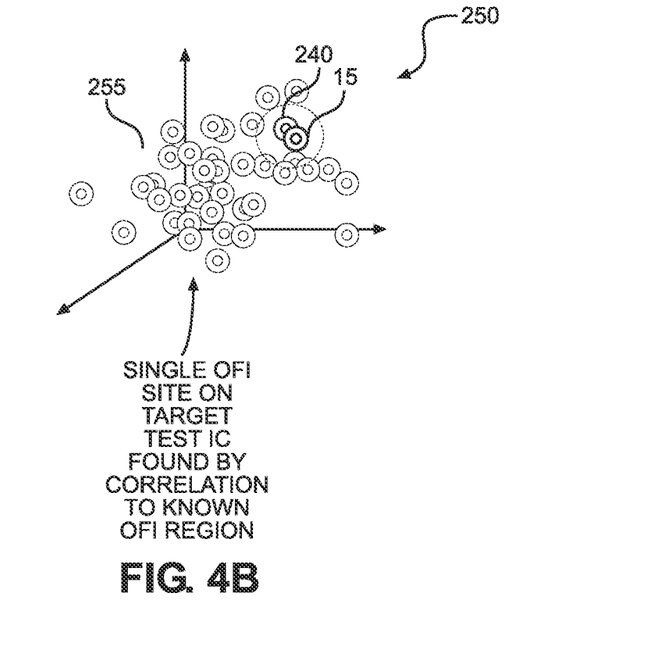
FIG. 4B is a three-dimensional graph showing vulnerable sites on the newly-designed IC.

FIG. 4B is a three-dimensional graph 250 of latent variables produced by variational auto encoder 100 during an analysis of integrated circuit 200. The latent variables are in a cluster 255. A location 240 of a possible site that is vulnerable to an optical fault injection attack is identified based on its correlation to vulnerable region 15 on integrated circuit 10.

Figure 5:
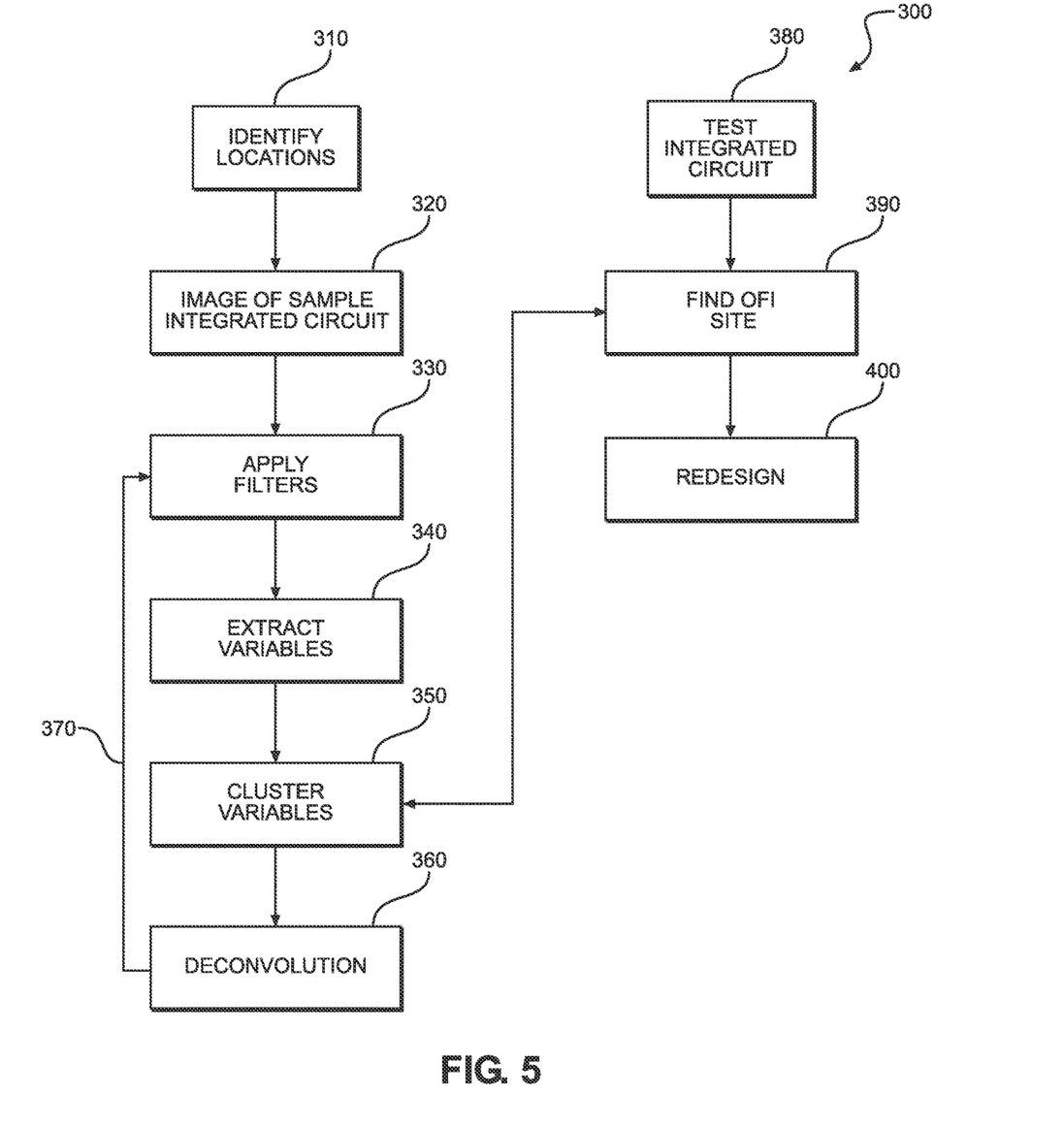
FIG. 5 is a flowchart of a method of predicting locations in the newly-designed IC that may be vulnerable to an OFI attack.

FIG. 5 illustrates a method 300 of identifying vulnerable regions in integrated circuits through structural correlation. Method 300 starts with identifying regions 15, 20 vulnerable to fault injection. A manufacturer of integrated circuits may become aware of vulnerable regions 15, 20 either because they have been found by customers or by people who have exploited such regions. In addition, manufactures test their own integrated circuits. Manufacturers can directly inspect the integrate circuits using known high magnification optical systems or by scanning electron microscopes. A discussion of inspecting integrated circuits for defects can be found in U.S. Pat. No. 10,181,185, incorporated herein by reference.

Alternatively, a manufacturer can try to induce a fault in the integrated circuit and find the vulnerable areas empirically. Regardless of how the known vulnerable regions 15, 20 are found, these known regions 15, 20 are identified at step 310.

Next, at step 320, sample integrated circuit 10 with known vulnerable regions 15, 20 is prepared for imaging and then imaged. Preparation includes delayering integrated circuit 10 so that the various internal structures can be imaged by optical techniques. For example, if one type of integrated circuit is to be imaged, several samples can be used. Imaging integrated circuit 10 is preferably performed by optical-based imaging systems which generate digital images. Such systems are not able to generate an image of each entire exposed layer, so several images are generated along a length and width of each exposed layer and are then stitched together to form an overall image for each layer. Next, each layer is tiled into grid, and tiles 61-64 and 71-74 of each layer 51-54 that represent vulnerable regions 15, 20 are separated from the overall image of each layer 51-54 and stacked such that the optical fault vulnerable regions 15, 20 are represented by multiple layers of images. For example, if four exposed layers are generated in the delayering process, each vulnerable region 15, 20 will have four images, one per layer, corresponding to each vulnerable region 15, 20. The images are preferably in digital form and include data regarding a structural layout of the metal, polysilicon and oxides that make up the localized vulnerable region.

At steps 330, 340, 350, 360 and 370, the data from the images is used in conjunction with various convolutional neural networks to determine how to predict the locations of new vulnerabilities existing in a new unverified design. More specifically, the data from the images is preferably processed to correct any clear artifacts in the images. Then, in steps 330 and 340, the digital images are fed into variational encoder 100 so that encoder 100 can learn by extracting latent variables 147, some of which represent features indicative of a vulnerability. Preferably, variational encoder 100 includes an encoder network 120 and a decoder network 150. Variational encoder 100 is preferably in the form of a feedforward non-recurrent neural network. Variational autoencoder 100 converts image data 61-64 and 71-74, which is considered high-dimensional data, into a lower-dimensional latent space which has latent variables 147 that are learned during encoding, as described above. During training of variational autoencoder 100, the data from known vulnerabilities is processed, and the encoder learns the parameters of distribution of latent variables 147. Also, in step 360, decoder 150 can be used on the latent space to generate reconstructed images 161-164 and 171-174 which are compared to image data 61-64 and 71-74 to determine any loss of data. Variational autoencoder 100 then alters latent variables 147 in step 370 to minimize loss of data until training is complete. The result is that training data 61-64 and 71-74 from the images of integrated circuit 10 with known vulnerabilities is dimensionally reduced to latent variables 147. An example of a variational encoder used to process images is found in world document WO 2018/192672, incorporated herein by reference, and an example of the mathematics used by variational encoders is found in "Tutorial on Variational Autoencoders" by Carl Doersch (referenced above).

The latent variables are clustered at step 350. The actual clustering is performed by encoder 130 during training. Latent variables 147 that represent images or features in images that are similar to one another will be closer to each other in latent space. As such, latent variables 147 form clusters. Latent variables 147 within some of the clusters, such as cluster 255 in FIG. 4B, will represent the location and attributes of a vulnerable region. Latent variables outside the clusters will not represent vulnerable locations. While not a preferred embodiment of the invention, this logic is reversed if one is looking for defects in a series of integrated circuits, as the training data would be from normally-functioning integrated circuits which would form clusters, and defects in the integrated circuits would be spotted as outliers not residing in a cluster.

In step 380, a new integrated circuit 200 with unknown fault regions is imaged in a manner similar to how the integrated circuits are imaged in step 320, thereby forming test image data suitable for processing by variational autoencoder 100.

In step 390, the learned model of variational autoencoder 100 is applied to the test image data to predict possible optical fault injection sites. The combined data is plotted as clustered latent variables as shown in FIG. 4B, and, if an overlapping point between a portion of cluster 255 representing a vulnerable region is developed, then the overlapping point 240 identifies a region on test integrated circuit 200 that is vulnerable to optical fault injection.

In step 400, the information learned in step 390 is used to redesign the test integrated circuit 200 to remove vulnerable location 240. If desired, the process can be repeated until no new vulnerable locations are found, resulting in test integrated circuit 200 being a more robust integrated circuit that is resistant to optical fault injection attacks.

Figure 6A:
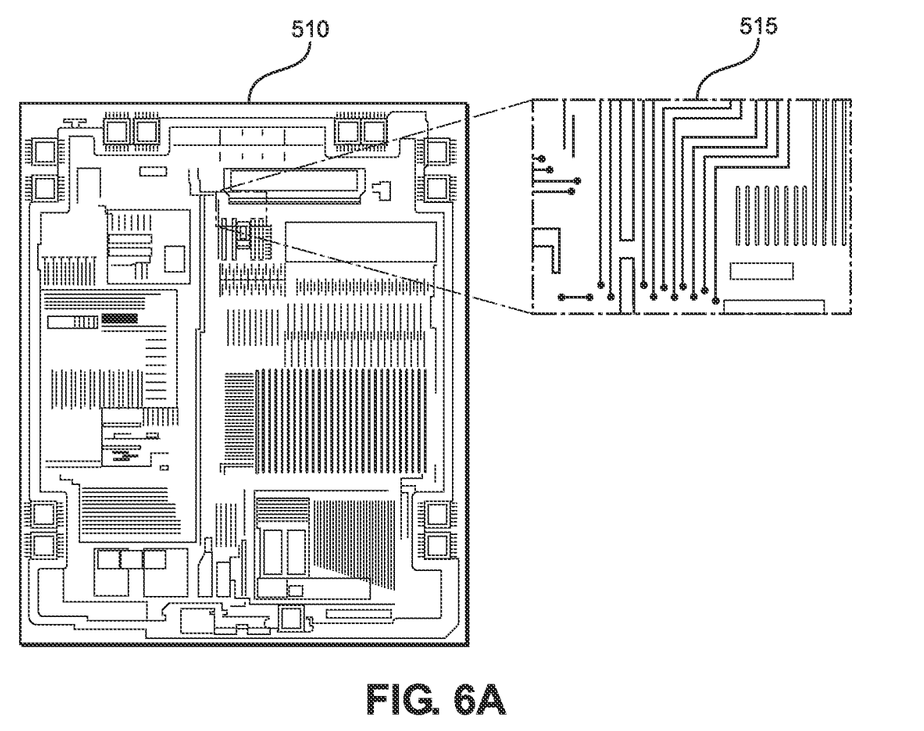
FIG. 6A is a schematic view of an image of commercial microcontroller chip A with an expanded view of an identified OFI-vulnerable location.
Figure 6B:
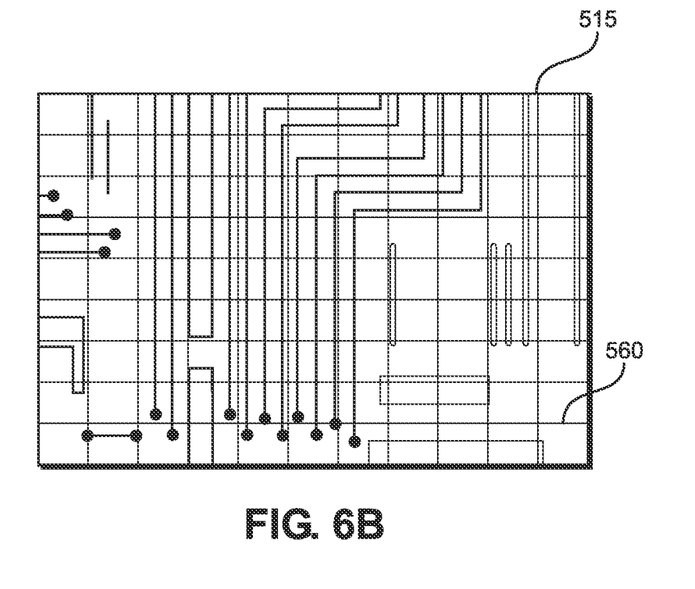
FIG. 6B shows the expanded view of the vulnerable location of FIG. 6A after being tiled.
Figure 7:
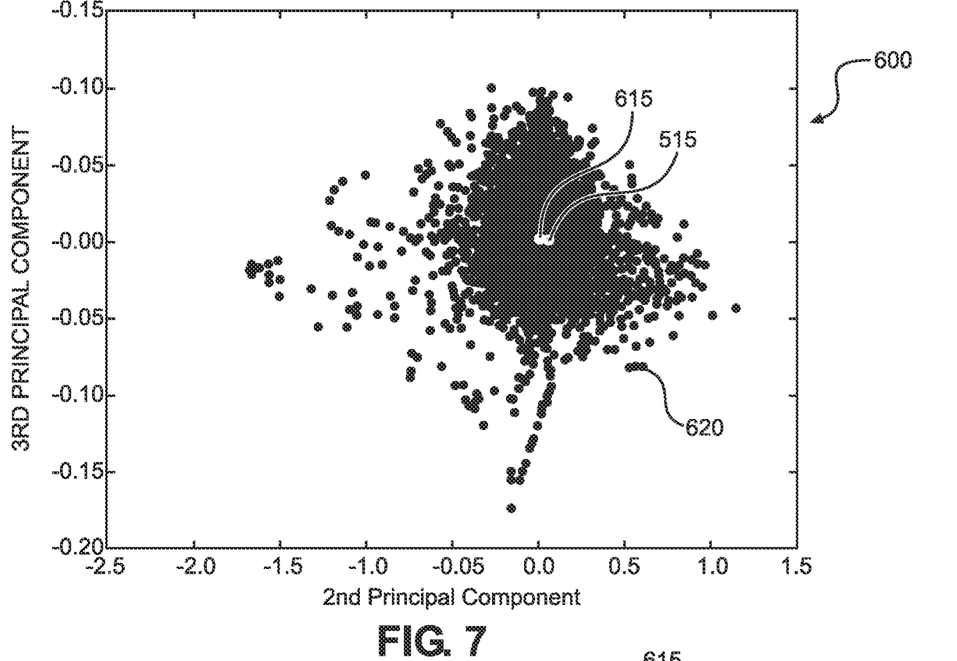
FIG. 7 is a graph produced by applying a model based on the microcontroller chip A to an image of a different model microcontroller in the same family, microcontroller chip B, showing a possible location vulnerable to OFI.
Figure 8:
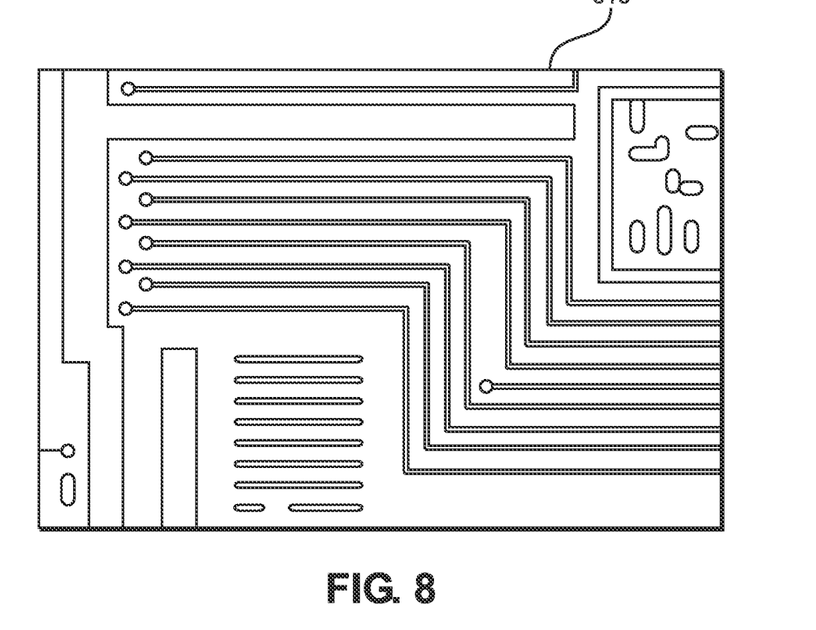
FIG. 8 shows a location on microcontroller chip Bis likely to be vulnerable to OFI.

FIGS. 6A, 6B, 7 and 8 show an example of method 300 being applied to a commercially-available integrated circuit designated microcontroller chip A. FIG. 6A shows an image 510 of microcontroller chip A with a region 515 that is vulnerable to optical fault injection. A portion of image 510 corresponding to region 515 is tiled as shown at 560 in FIG. 6B. Applying method 300 yields data from microcontroller chip A to train variational autoencoder 100. Then, information from an integrated circuit being developed (in this case, microcontroller chip B) is provided to variational autoencoder 100. FIG. 7 is a graph 600 showing how vulnerable site 515 corresponds to a found site 615 in cluster 620, indicating that site 615 of microcontroller chip B is vulnerable to optical fault injection. FIG. 8 shows vulnerable site 615 in an image of microcontroller chip B.

Having thus described several illustrative embodiments of the present disclosure, those of skill in the art will readily appreciate that yet other embodiments can be made and used within the scope of the claims hereto attached. Numerous advantages of the disclosure covered by this document have been set forth in the foregoing description. It will be understood, however, that this disclosure is, in many respects, only illustrative. Changes can be made in details. The disclosure's scope is, of course, defined in the language in which the appended claims are expressed.

What is claimed is:

1. A method of identifying a vulnerable region on a target integrated circuit, the method comprising:

training a neural network to identify regions of an integrated circuit that are vulnerable based on a known vulnerable region of a sample integrated circuit;

identifying a vulnerable region on a target integrated circuit, that has regions that are potentially vulnerable, with the neural network; and imaging the sample integrated circuit to create sample image data and wherein training the neural network includes providing the neural network with the sample image data.

2. The method according to claim 1, wherein the vulnerable region is vulnerable to optical fault injection.

3. The method according to claim 1 further comprising preparing the sample integrated circuit for imaging, including delayering the sample integrated circuit into layers, polishing the layers and ion etching the layers.

4. The method according to claim 1, wherein imaging the sample integrated circuit includes creating an overall layered image of the sample integrated circuit and separating a layered sub image of the known vulnerable region from the overall layered image, the layered sub image including data about a structural layout of metal, polysilicon and oxides that make up the region that is known to be vulnerable.

5. The method according to claim 4 further comprising separating the layered sub image into a layered grid and converting the layered grid into the sample image data.

6. The method according to claim 1 further comprising creating a modified target integrated circuit by altering a design of the vulnerable region so that the modified target integrated circuit is not vulnerable to optical fault injection at a region of the modified target integrated circuit corresponding to the vulnerable region, thereby forming a robust integrated circuit.

7. The method according to claim 1, wherein the neural network is a variational autoencoder including an encoder and a decoder and wherein training the neural network further includes training the variational autoencoder by
   applying convolution filters to the sample image data with the encoder to produce latent variables,
   extracting the latent variables,
   deconvoluting the latent variables with the decoder to produce reconstructed image data,
   changing the latent variables to reduce a difference between the reconstructed image data and the sample image data, and
   ending training and preventing further changes in the latent variables when the difference is below a threshold.

8. The method according to claim 7, wherein identifying the vulnerable region on the target integrated circuit includes imaging the target integrated circuit to create target image data and providing the neural network with the target image data.

9. The method according to claim 8, wherein training the variational autoencoder includes clustering the latent variables in latent space into clusters, with a cluster being based on a location and features in the sample image data about a structural layout of metal, polysilicon and oxides that make up the region that is known to be vulnerable.

10. The method according to claim 9 wherein identifying the vulnerable region on the target integrated circuit includes encoding the target image data into latent target data in the latent space and determining when the latent target data overlaps the cluster.

11. The method according to claim 1, wherein
   the neural network is a variational autoencoder;
   training the neural network includes:
      inputting image data obtained from a known vulnerable region on a sample integrated circuit into the variational autoencoder; and
   identifying the vulnerable region includes:
      reducing, with the variational autoencoder, a dimensionality of the image data by converting the image data into latent variables in a latent space such that latent variables corresponding to an image of the known vulnerable region create a cluster in latent space;
      inputting target image data from the target integrated circuit into the variational autoencoder, reducing, with the variational autoencoder, a dimensionality of the target image data by converting the target image data into target latent variables in the latent space; and
      determining that a vulnerable region is present on the target integrated circuit that is vulnerable to optical fault injection when the target latent variables overlap the cluster.

12. The method according to claim 11 further comprising imaging the sample integrated circuit to create the image data.

13. The method according to claim 12 further comprising preparing the sample integrated circuit for imaging, including delayering the sample integrated circuit into layers, polishing the layers and ion etching the layers.

14. The method according to claim 12, wherein imaging the sample integrated circuit includes creating an overall layered image of the sample integrated circuit and separating a layered sub image of the known vulnerable region from the overall layered image, the layered sub image including data about a structural layout of metal, polysilicon and oxides that make up the known vulnerable region.

15. The method according to claim 11 further comprising creating a modified target integrated circuit by altering a design of the vulnerable region so that the modified target integrated circuit is not vulnerable to an optical fault injection at a region of the modified target integrated circuit corresponding to the vulnerable region, thereby forming a robust integrated circuit.

16. A system for identifying a region in an integrated circuit that contains vulnerable region, the system comprising:
   a neural network configured to:
      be trained to identify regions that are vulnerable based on a region that is known to be vulnerable on a sample integrated circuit; and
      identify a vulnerable region on a target integrated circuit that has regions that are potentially vulnerable,
   wherein:
      the neural network is trained using sample image data obtained by imaging a sample integrated circuit.

17. The system according to claim 16 further comprising an imaging system configured to image the target integrated circuit that has regions that are potentially vulnerable to optical fault injection to create target image data;
   wherein the neural network is a variational autoencoder including
      an encoder configured to apply convolution filters to the sample image data to produce latent variables,
      a decoder having deconvolutional filters configured to deconvolute the latent variables to produce reconstructed image data, and
      a loss function configured to change the latent variables to reduce a difference between the reconstructed image data and the sample image data.

18. The system according to claim 17, wherein the latent variables are formed into clusters in latent space, with a cluster being based on a location and features in the sample image data about a structural layout of metal, polysilicon and oxides that make up the region that is known to be vulnerable.

19. The system according to claim 18, wherein the variational autoencoder is further configured to produce latent target data from the target image data and to determine when the latent target data overlaps the cluster.

\* \* \* \* \*